United States Patent [19]

Oku

[11] Patent Number: 4,851,680
[45] Date of Patent: Jul. 25, 1989

[54] JOSEPHSON JUNCTION TYPE RADIATION ENERGY ANALYZER

[75] Inventor: Tomoki Oku, Itami, Japan

[73] Assignee: Mitsubishi Denki Kabushiki Kaisha, Japan

[21] Appl. No.: 119,725

[22] Filed: Nov. 12, 1987

[30] Foreign Application Priority Data

Sep. 2, 1987 [JP] Japan ................. 62-219798

[51] Int. Cl.$^4$ .................. G01J 5/00; H01L 39/22
[52] U.S. Cl. .................. 250/336.2; 250/370.15; 357/5; 505/848; 505/874
[58] Field of Search ............ 250/336.2, 370.15; 505/832, 848, 849, 874; 357/5

[56] References Cited

U.S. PATENT DOCUMENTS 4,589,001 5/1986 Sakai et al. ................. 357/5

FOREIGN PATENT DOCUMENTS 951072 3/1964 United Kingdom ........... 250/370.15

OTHER PUBLICATIONS

J. Matisoo, "Modification of Tunnel Junction Resistance in Josephson Devices," *IBM Technical Disclosure Bulletin*, vol. 16, No. 5 (Oct. 1973), pp. 1437–1439.

Neuhauser et al., "Acoustic Detection of Single Particles . . . Matter Searches", *Transactions of Magnetics*, vol. MAG-23, No. 2 (Mar. 1987), pp. 469–472.

Ishibashi et al., "Possible Use of Bulk Superconductor . . . Radiation Spectroscopy", *Nuclear Instruments and Methods of Physics Research*, 227 (1984), pp. 483–488.

Twerenbold et al., "Superconducting Sn/Sn-Oxide Tunneling . . . X-Ray Detectors", *J. Appl. Phys.*, 61 (1) (Jan. 1, 1987), pp. 1–7.

"Measurements of the Nonradiative States of Optically Illuminated Semiconductors by a Superconducting Tunnel Junction", by I. Iguchi and Y. Kasai, *Appl. Phys. Lett.*, 49 (1986), p. 371.

"Superconductor Light Relaxation Spectroscopy", *Solid State Physics*, vol. 22, No. 2 (1987), p. 39.

*Primary Examiner*—Constantine Hannaher
*Attorney, Agent, or Firm*—Leydig, Voit & Mayer

[57] ABSTRACT

A Josephson junction type radiation energy analyzer comprising: a tunnel junction comprising a triple layer of superconductor-insulator-superconductor; and a metal layer which is provided in contact with one of the superconductors of the tunnel junction and to which radiation is incident.

14 Claims, 2 Drawing Sheets

JOSEPHSON JUNCTION TYPE RADIATION ENERGY ANALYZER

FIELD OF THE INVENTION

The present invention relates to a radiation energy analyzer using a Josephson junction.

BACKGROUND ART

FIG. 3 shows a prior art semiconductor analyzer used for energy analysis of radiation ($\gamma$ rays, X rays, and charged particles). As shown in FIG. 3, the n type semiconductor 11 - metal 13 junction portion or the p type semiconductor 13 - n type semiconductor 11 junction portion has a depletion layer 12. A voltage is applied to the analyzer and almost all of the voltage appears across the depletion layer 12. Furthermore, the thickness of the depletion layer 12 is larger than the range of the incident radiation.

The device is operated as follows.

When incident radiation reaches the depletion layer 12, electron and hole charge carrier pairs are generated, and they are collected at the electrodes by the applied electric field. The energy of charges collected is proportional to the energy E of the incident radiation, and energy analysis of the radiation can be carried out. Herein, the factors limiting the resolution of the energy analysis are as follows.

(a) The statistical error $N^{1/2}$ for the number N of generated electron-hole pairs, (b) Fluctuation of the radiation energy consumed other than in the generation of electron-hole pairs, (c) Thermal noise and fluctuation inherent in the characteristics of the detection system.

Among the above-described factors that of (a) can be estimated. When a semiconductor detector comprising silicon is used, the energy W required to generate an electron-hole pair is 3.6 eV, and when radiation of E=1 MeV is detected, approximately N=E/W electron-hole pairs are generated. The distribution N is a normal distribution of $\sigma = N^{1/2}$, and the energy resolution $\Delta E$ follows when it is represented by a half value width is $$\Delta E = 2.36\sigma \cdot W = 2.36(EW)^{1/2} = 4 \text{ KeV} \quad (1)$$

Generally, $\Delta E$ is about 10 KeV because of the above-described factors (b) and (c). Thus, $\Delta E / E$ becomes about $10^{-2}$.

A prior art radiation energy analyzer of such a construction has the following drawbacks.

1. A resolution $\Delta E/E$ of only about $10^{-2}$ is obtained because of the above-described factors (a), (b), and (c).

2. The device utilizes a surface barrier and a junction which are likely to deteriorate when the temperature rises. The surface barrier deteriorates above 100° C., and the junction deteriorates at about room temperature. Therefore, it is not possible to bake out gases or to maintain the device at an ordinary temperature. Yet, gas exhaustion is inevitably required when an analyzer is attached to an apparatus of an ultra high vacuum of such as $10^{-10}$ Torr.

SUMMARY OF THE INVENTION

An object of the present invention is to provide an improved radiation energy analyzer having an enhanced energy resolution $\Delta E/E$ in which baking and an ordinary temperature maintenance are available.

Other objects and advantages of the present invention will become apparent from the detailed description given hereinafter. It should be understood, however, that the detailed description and specific embodiment are given by way of illustration only, since various changes and modifications within the spirit and scope of the invention will become apparent to those skilled in the art from this detailed description.

According to the present invention, there is provided a Josephson junction type radiation energy analyzer comprising: a tunnel junction comprising a triple layer of superconductor-insulator-superconductor; and a metal layer provided in contact with one of the superconductors of the tunnel junction to which radiation is incident.

DETAILED DESCRIPTION OF THE PREFERRED EMBODIMENTS

Figure 1:
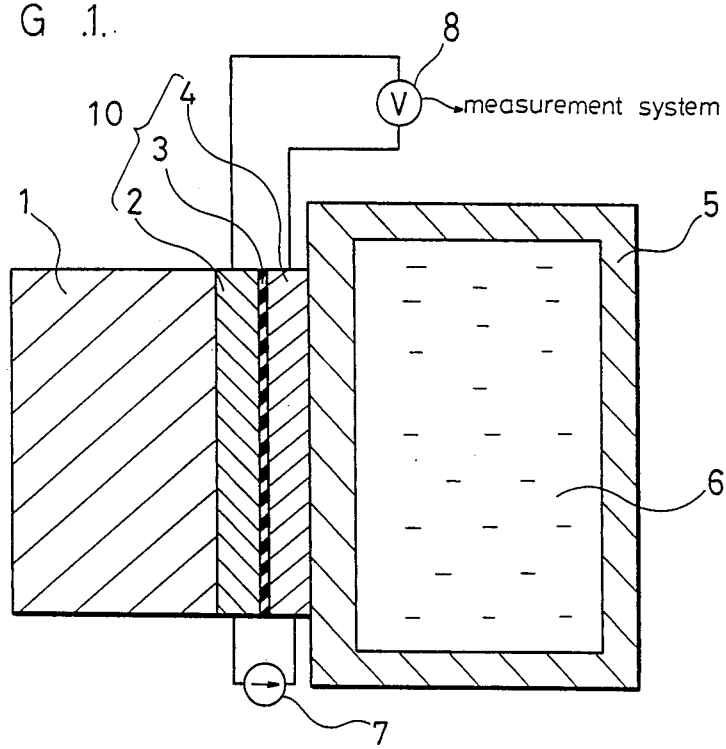
FIG. 1 is a diagram showing a radiation energy analyzer in an embodiment of the present invention.

In order to explain the present invention in detail, reference will be particularly made to FIG. 1.

FIG. 1 shows a Josephson junction type radiation energy analyzer in an embodiment of the present invention. In FIG. 1, the reference numeral 1 designates a metal on which radiation is incident. The reference numeral 10 designates a Josephson junction comprising superconductor 2 - insulator 3 -superconductor 4. The reference numeral 5 designates a metal for cooling the Josephson junction, and the reference numeral 6 designates liquid helium for cooling. The reference numeral 7 designates a constant current source for establishing a constant flow of biasing current through the Josephson junction 10. The reference numeral 8 designates a means for detecting the voltage change across the Josephson junction.

Herein, the metal 1 to which radiation is incident is made thicker than the range of the radiation so that the incident radiation may lose all of its energy therein.

The device is operated as follows.

When radiation is incident to the metal 1, electrons in the metal 1 are excited by the incident radiation, and the excitation energy produces phonons. These phonons are incident on the Josephson junction 10 comprising superconductor 2 - insulator 3 -superconductor 4, and destroy the Cooper pairs in the Josephson junction.

Figure 2:
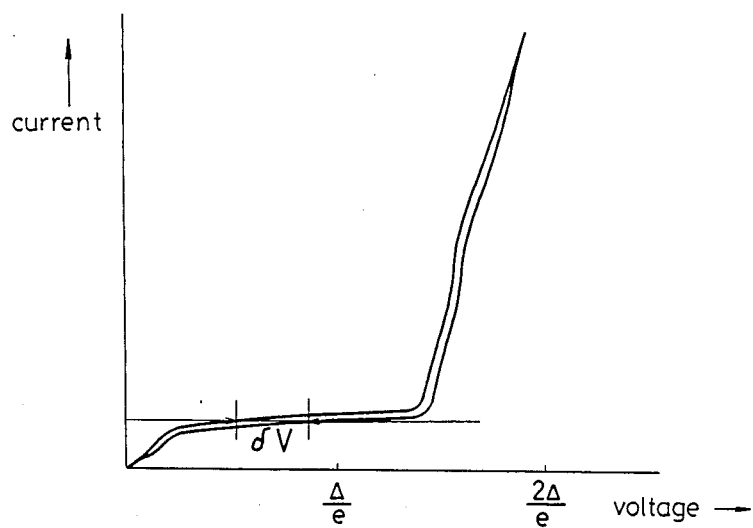
FIG. 2 is a diagram exemplifying the operation of the analyzer of FIG. 1.
Figure 3:
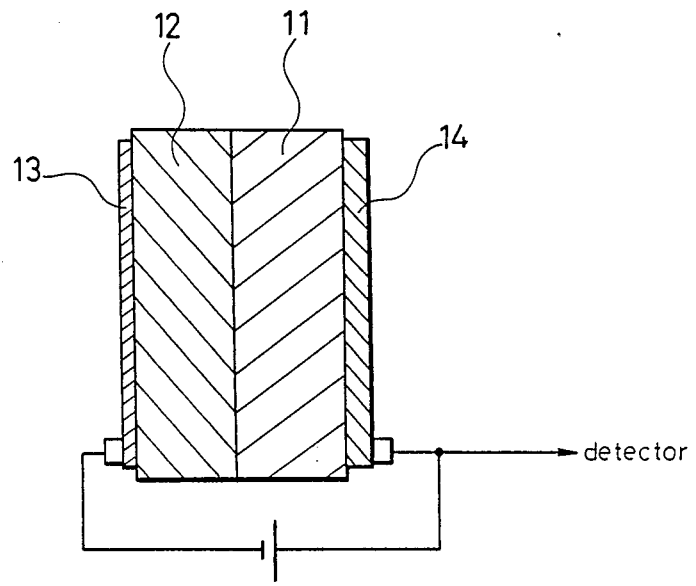
FIG. 3 is a diagram showing a prior art radiation energy analyzer.

FIG. 2 shows I-V characteristics of the Josephson junction before and after Cooper pairs are destroyed. As shown in FIG. 2, the increase in the concentration of quasi-particles due to the destruction of Cooper pairs induces an increase in the quasi-particle current and a decrease in the gap at the sub-gap region. When this change is measured, a signal corresponding to incident phonons is obtained. In this embodiment, a constant current bias of a value at the flat portion of the curve of FIG. 2 is applied by the constant current source 7. Under such a biasing condition a high sensitivity phonon detection output is obtained by the voltage change detecting means 8 because the flat portion of the curve provides a large voltage change in response to a small current change.

The energy required to destroy a Cooper pair is from several meV to several tens of meVs. The energy resolution due to the statistical error is about 100 eV from the formula (1). Accordingly, compared to the prior art device, it is possible to enhance the energy resolution by two order of magnitude. Furthermore, since only the incident radiation which here become phonons finally is detected in this measurement, one detection error present in the prior art device does not arise. The detection error corresponding to the fluctuation of radiation energy consumed other than in the generation of electron-hole pairs, as in the prior art device, does not arise. Furthermore, the detection with the use of the Josephson junction is conducted at a low temperature at which thermal noise does not give rise to any problem. In this embodiment the thermal noise and fluctuation inherent in the characteristics of the prior art device are small.

Furthermore, in this embodiment the cooling metal 5 is provided so as to cool only from the side of the Josephson junction, and accordingly the generated phonons can be detected in their totality.

Furthermore, as the analyzer of the embodiment has a junction which is not likely to react in response to increased temperature, gas can be expelled by heating and the device can be maintained at an ordinary temperature.

Thus, the device of the present embodiment can be used in an ultra high vacuum apparatus, and in an actual device the metal portion 1, superconductor 2, insulator 3, and superconductor 4 are disposed in an ultra high vacuum such as $10^{-10}$ Torr. Thus, the heat generated by the incidence of radiation on the metal portion 1 is only dispersed from the surface thereof in contact with the superconductor 2, and all the incident radiation is detected efficiently.

An example of material and thickness of the metal 1 used in the present embodiment is given as follows. That is, the thickness of the metal is preferably about twice the range. By way of suggestion, when Au is used as the material the relation between the incident radiation energy and the range is such that a range of 15 $\mu$m occurs at an energy of 2000 KeV (refer to H. H. Andersen and J. F. Ziegler, "The Stopping Power and Ranges of Ions in Matter", ed. J. F. Ziegler (Pergamon, N.Y. 1977)). By adopting a metal of such thickness, the incident radiation energy is converted into heat (phonons) in its totality, and the detection precision is enhanced.

Furthermore, in the present embodiment the cooling uses liquid helium, but this cooling may be achieved with liquid nitrogen when a high temperature superconductor is used as superconductors 2 and 4.

As is evident from the foregoing description, according to the present invention, a Josephson junction comprising a triple layer structure of superconductor-insulator-superconductor is used for energy analysis, and a metal on which radiation is incident is provided in contact with a superconductor of the Josephson junction, whereby the energy resolution $\Delta E / E$ can be made small, gas may be thermally expelled from the device, and the device can be maintained at an ordinary temperature.

What is claimed is:

1. A radiation energy analyzer comprising:
    a Josephson tunnel junction including serially disposed layers of superconductor-insulator-superconductor and having a tunnel junction resistance that changes in response to the incidence of phonons on said superconductor layers; and
    a metal layer disposed in contact with one of said superconductors of said tunnel junction for transforming incident radiation into phonons and for conducting said phonons to said superconductor in contact with said metal layer.

2. A radiation energy analyzer as defined in claim 1 including means for cooling said tunnel junction from the superconductor opposite said metal layer.

3. A radiation analyzer as defined in claim 2 wherein said tunnel junction and said metal layer are disposed in an ultra high vacuum.

4. A radiation energy analyzer as defined in claim 1 wherein said tunnel junction and said metal layer are disposed in an ultra high vacuum.

5. A radiation energy analyzer as defined in claim 1 wherein said metal layer has a thickness exceeding the range of penetration of incident radiation in said metal layer.

6. A radiation analyzer as defined in claim 1 wherein said metal layer is gold.

7. A radiation energy analyzer comprising:
    a Josephson junction including, serially disposed, a first superconductor layer, an electrically insulating layer, and a second superconductor layer;
    a metal layer disposed on said first superconductor layer for transforming incident radiation into phonons and for conducting said phonons to said first superconductor layer;
    means for cooling said Josephson junction disposed in contact with said second superconductor layer;
    means for producing a constant current flow through said Josephson junction; and
    means for measuring changes in voltage across said Josephson junction produced in response to the incidence of radiation on said means for transforming.

8. The radiation analyzer as defined in claim 7 wherein said metal layer has a thickness exceeding the range of penetration of incident radiation in said metal layer.

9. The radiation analyzer as defined in claim 7 wherein said metal layer is gold.

10. A method of determining the energy of incident radiation, such as gamma rays, beta rays, and alpha particles, comprising:
    cooling a Josephson junction to a superconducting temperature, said Josephson junction including, serially disposed, a first superconducting layer, an insulator, and a second superconducting layer;
    placing in the path of incident radiation a layer of metal disposed on said first superconducting layer for producing phonons in said metal layer in response to incident radiation;
    conducting said phonons to said first superconducting layer;
    passing a constant current through said Josephson junction; and
    measuring the changes in the voltage across said Josephson junction produced in response to said incident radiation whereby the energy of said incident radiation is determined.

11. The method as defined in claim 10 including choosing the thickness of said metal layer to exceed the range of penetration of said radiation in said metal layer.

12. The method of claim 10 including disposing said Josephson junction in an ultra high vacuum.

13. The method of claim 10 including cooling said Josephson junction with a cooling means disposed in contact with said second superconducting layer.

14. The method of claim 10 including disposing a layer of gold on said first superconducting layer as said metal layer for producing phonons.

* * * * *